United States Patent
Rehwald

(10) Patent No.: US 10,145,919 B2
(45) Date of Patent: Dec. 4, 2018

(54) CHARGE BALANCE MODELING SYSTEM FOR MRI SEQUENCES

(71) Applicant: Siemens Healthcare GmbH, Erlangen (DE)

(72) Inventor: Wolfgang G. Rehwald, Chapel Hill, NC (US)

(73) Assignee: Siemens Healthcare GmbH, Erlangen (DE)

( * ) Notice: Subject to any disclaimer, the term of this patent is extended or adjusted under 35 U.S.C. 154(b) by 375 days.

(21) Appl. No.: 15/157,446

(22) Filed: May 18, 2016

(65) Prior Publication Data
US 2017/0336487 A1 Nov. 23, 2017

(51) Int. Cl.
G01R 33/54 (2006.01)
G01R 33/561 (2006.01)
G01R 33/36 (2006.01)

(52) U.S. Cl.
CPC ....... G01R 33/546 (2013.01); G01R 33/3614 (2013.01)

(58) Field of Classification Search
CPC .......................... G01R 33/546; G01R 33/3614
USPC ................................................ 324/300–322
See application file for complete search history.

(56) References Cited

U.S. PATENT DOCUMENTS

2008/0319301 A1* 12/2008 Busse ................ G01R 33/5615
600/410
2010/0121179 A1* 5/2010 Min ..................... G01R 33/583
600/421

\* cited by examiner

*Primary Examiner* — Melissa Koval
*Assistant Examiner* — Rahul Maini

(57) ABSTRACT

An imaging system comprises determination of a charge block for each building block of an MRI pulse sequence and for each readout event of the MRI pulse sequence, determination, for each charge block, of a charge per request associated with the charge block, determination, for each charge block, of an associated charge reduction based on a charge per request associated with the charge block and on a charge available to the charge block after execution of a previous charge block of the MRI pulse sequence, determination, for each charge block associated with a non-zero charge reduction, of a flip angle of a corresponding building block of the MRI pulse sequence based on a charge per request and a charge reduction associated with the charge block, and control of a radio frequency system to deliver the MRI pulse sequence based on the determined flip angles of each building block of the MRI pulse sequence corresponding to a charge block associated with a non-zero charge reduction.

20 Claims, 7 Drawing Sheets

```
[00]   FillPre    dOriginalChargeInBlock_us = +16707.00  | lBlockDuration_us = 0334140 | bLastInTReff = 0
[01]   MTPrep     dOriginalChargeInBlock_us = -18964.87  | lBlockDuration_us = 0172460 | bLastInTReff = 0
[02]   IRPrep     dOriginalChargeInBlock_us = -01586.20  | lBlockDuration_us = 0020650 | bLastInTReff = 0
[03]   FillToRO   dOriginalChargeInBlock_us = +00237.00  | lBlockDuration_us = 0004740 | bLastInTReff = 0
[04]   PreROT     dOriginalChargeInBlock_us = +00330.42  | lBlockDuration_us = 0033310 | bLastInTReff = 0
[05]   ROTrain    dOriginalChargeInBlock_us = -15113.13  | lBlockDuration_us = 0434700 | bLastInTReff = 0
[06]   FillPre    dOriginalChargeInBlock_us = +16707.00  | lBlockDuration_us = 0334140 | bLastInTReff = 0
[07]   MTFill     dOriginalChargeInBlock_us = +08623.00  | lBlockDuration_us = 0172460 | bLastInTReff = 0
[08]   IRFill     dOriginalChargeInBlock_us = +01032.50  | lBlockDuration_us = 0020650 | bLastInTReff = 0
[09]   FillToRO   dOriginalChargeInBlock_us = +00237.00  | lBlockDuration_us = 0004740 | bLastInTReff = 0
[10]   RefPre     dOriginalChargeInBlock_us = +00029.37  | lBlockDuration_us = 0033310 | bLastInTReff = 0
[11]   RefROT     dOriginalChargeInBlock_us = -01343.39  | lBlockDuration_us = 0434700 | bLastInTReff = 1
```

*FIG. 4*

| [index] | description | original charge | required reduction | fair exchange reduction | charge sum | bLastInTReff |
|---|---|---|---|---|---|---|
| [00] | FillPre  | +16707.00 | +00000.00 | +00000.00 | +20000.00 | 0 |
| [01] | MTPrep   | -18964.87 | +00000.00 | +00000.00 | +01035.13 | 0 |
| [02] | IRPrep   | -01586.20 | -00551.07 | +00000.00 | +00000.00 | 0 |
| [03] | FillToRO | +00237.00 | +00000.00 | +00000.00 | +00237.00 | 0 |
| [04] | PreROT   | +00330.42 | +00000.00 | +00000.00 | +00567.42 | 0 |
| [05] | ROTrain  | -15113.13 | -14545.71 | +00000.00 | +00000.00 | 0 |
| [06] | FillPre  | +16707.00 | +00000.00 | +00000.00 | +16707.00 | 0 |
| [07] | MTFill   | +08623.00 | +00000.00 | +00000.00 | +20000.00 | 0 |
| [08] | IRFill   | +01032.50 | +00000.00 | +00000.00 | +20000.00 | 0 |
| [09] | FillToRO | +00237.00 | +00000.00 | +00000.00 | +20000.00 | 0 |
| [10] | RefPre   | +00029.37 | +00000.00 | +00000.00 | +20000.00 | 0 |
| [11] | RefROT   | -01343.39 | +00000.00 | +00000.00 | +18656.61 | 1 |

*FIG. 5*

| [index] | description | original charge | required reduction | fair exchange reduction | charge sum | bLastInTReff |
|---|---|---|---|---|---|---|
| [00]  | FillPre  | +16707.00 | +00000.00 | +00000.00 | +20000.00 | 0 |
| [01]  | MTPrep   | -20551.07 | -00551.07 | +00000.00 | +00000.00 | 0 |
| [02]  | IRPrep   | +00000.00 | +00000.00 | +00000.00 | +00000.00 | 0 |
| [01]a | MTPrep   | -18964.87 | -00551.07 | +00000.00 | +01586.20 | 0 |
| [02]a | IRPrep   | -01586.20 | +00000.00 | +00000.00 | +00000.00 | 0 |
| [03]  | FillToRO | +00237.00 | +00000.00 | +00000.00 | +00237.00 | 0 |
| [04]  | PreROT   | +00330.42 | +00000.00 | +00000.00 | +00567.42 | 0 |
| [05]  | ROTrain  | -15113.13 | -14545.71 | +00000.00 | +00000.00 | 0 |
| [06]  | FillPre  | +16707.00 | +00000.00 | +00000.00 | +16707.00 | 0 |
| [07]  | MTFill   | +08623.00 | +00000.00 | +00000.00 | +20000.00 | 0 |
| [08]  | IRFill   | +01032.50 | +00000.00 | +00000.00 | +20000.00 | 0 |
| [09]  | FillToRO | +00237.00 | +00000.00 | +00000.00 | +20000.00 | 0 |
| [10]  | RefPre   | +00029.37 | +00000.00 | +00000.00 | +20000.00 | 0 |
| [11]  | RefROT   | -01343.39 | +00000.00 | +00000.00 | +18656.61 | 1 |

*FIG. 6*

| [index] | description | original charge | required reduction | fair exchange reduction | charge sum | bPartOfShare |
|---|---|---|---|---|---|---|
| [00] | FillPre | +16707.00 | +00000.00 | +00000.00 | +20000.00 | 0 |
| [01] | MTPrep | -20551.07 | -00551.07 | -08148.27 | +08148.27 | 1 |
| [02] | IRPrep | +00000.00 | +00000.00 | +00000.00 | +08148.27 | 0 |
| | | | | | | |
| [01]a | MTPrep | -18964.87 | -00551.07 | -07850.49 | +09436.69 | 1 |
| [02]a | IRPrep | -01586.20 | +00000.00 | +00000.00 | +07850.49 | 0 |
| | | | | | | |
| [03] | FillToRO | +00237.00 | +00000.00 | +00000.00 | +08087.49 | 0 |
| [04] | PreROT | +00330.42 | +00000.00 | +00000.00 | +08417.91 | 0 |
| [05] | ROTrain | -15113.13 | -14545.71 | +07850.49 | -00000.00 | 1 |
| [06] | FillPre | +16707.00 | +00000.00 | +00000.00 | +16707.00 | 0 |
| [07] | MTFill | +08623.00 | +00000.00 | +00000.00 | +20000.00 | 0 |
| [08] | IRFill | +01032.50 | +00000.00 | +00000.00 | +20000.00 | 0 |
| [09] | FillToRO | +00237.00 | +00000.00 | +00000.00 | +20000.00 | 0 |
| [10] | RefPre | +00029.37 | +00000.00 | +00000.00 | +20000.00 | 0 |
| [11] | RefROT | -01343.39 | +00000.00 | +00000.00 | +18656.61 | 0 |

*FIG. 7*

┌─────────────────────────────────────────────── 800
│ ▒▒▒▒▒▒▒▒
│
│         TR  [1000.00] ms          Fat suppr. [None ▼]
│         TE  [1.58]    ms
│        MTC  ☐
│ Mag. preparation [FIDDLE Prod Ga ▼]
│         TI  [265]     ms
│                                   Wrap-up Magn. [None ▼]
│
│  Flip angle [90] deg        ┌─ 810
│                             │ clipping = 0.75
│         TR  ├──────────────│ charge reduction = 0.58  ──┤ 1000
│                             │ true angle = 39.10°
└───────────────────────────────────────────────

*FIG. 8*

┌─────────────────────────────────────────────── 900
│ ▒▒▒▒▒▒▒▒▒▒▒▒
│
│   Number modules    [10]    ms
│   Pulse duration    [9728]  ms
│   Inter-modules gap [7500]  ms
│
│         Flip Angle  [1000]  ms              ┌─ 910
│    Offset Frequency [500]   m│ MaxV reduction factor = 0.783
│                              │ Q reduction factor = 0.685
│                              │ Total reduction factor = 0.536
│                              │ Actual flip angle = 535.800°
│                                   10
│   Number   ├────────────────────┼──────────────────┤
│   Modules
└───────────────────────────────────────────────

*FIG. 9*

CHARGE BALANCE MODELING SYSTEM FOR MRI SEQUENCES

BACKGROUND

An MRI scanner generates images of patient anatomy based on sequences of RF pulses. An RF power amplifier generates and stores the electrical charge needed to emit the pulses. Currently, reliable image quality is achieved by sizing the RF power amplifier and other RF transmission parts based on the most charge-intensive foreseen imaging applications. For example, the RF components of an MRI scanner are typically selected such that they may generate and store enough charge to successively execute two energy-demanding pulse sequence blocks (i.e., an adiabatic T2-preparation module and a single-shot TrueFisp readout) without running out of charge. However, these pulse sequence blocks are used in an imaging application which represents approximately 1% of all MRI scans, and therefore the total energy capacity of the RF components is usually underutilized. Even so, in the case of some patients, this total energy capacity is still insufficient for executing the above-mentioned energy-demanding pulse sequence blocks.

It is desirable to produce improved MRI image quality for a given charge generation and storage capability. Such improvements may allow the use of less expensive RF components than conventional MRI scanners, while maintaining suitable image quality.

BRIEF DESCRIPTION OF THE DRAWINGS

FIG. 4 is a tabular representation of charge block parameters according to some embodiments.

FIG. 5 is a tabular representation of charge block parameters according to some embodiments.

FIG. 6 is a tabular representation of charge block parameters according to some embodiments.

FIG. 7 is a tabular representation of charge block parameters according to some embodiments.

FIG. 8 is an outward view of a user interface for illustrating a changed flip angle associated with a charge block according to some embodiments.

FIG. 9 is an outward view of a user interface for illustrating a changed flip angle associated with a charge block according to some embodiments.

DETAILED DESCRIPTION

The following description is provided to enable any person in the art to make and use the described embodiments. Various modifications, however, will remain readily apparent to those in the art.

Generally, some embodiments provide charge balance assessment, reduction and redistribution among charge blocks of an MRI pulse sequence. Some embodiments allow for a controlled distribution of an RF power amplifier's overall available charge to the individual charge blocks which enforces a charge-compliant protocol by reducing the flip angle of the refocusing pulses of the readout train. More specifically, flip angles and implicit time delays may be adjusted so that a) the RF power amplifier does not run out of energy (i.e., the entire pulse sequence run completes successfully), and that b) each charge block receives sufficient energy to produce suitable image quality.

For example, some embodiments ensure that a single echo train (i.e., excitation pulse plus multiple subsequent refocusing pulses) does not exceed the maximum charge available. The charge may be calculated as maximum charge stored in the RF power amplifier at the beginning of the measurement, minus the charge used by the excitation pulse and the refocusing pulses, plus the charge provided by the continuous recharging while the echo train runs. The charge created by the continuous recharging may be modeled as proportional to the duration of the echo train. In case more charge is required for a given pulse than will be available, the refocusing pulses' flip angle is reduced so that zero (or more) charge remains at the end of the first echo train. Additionally, some embodiments determine whether the charge is also sufficient for executing the remaining effective repetitions of the scan. If not, a further flip angle reduction is applied so that zero (or more) charge remains at the end of the last echo train.

Figure 1:
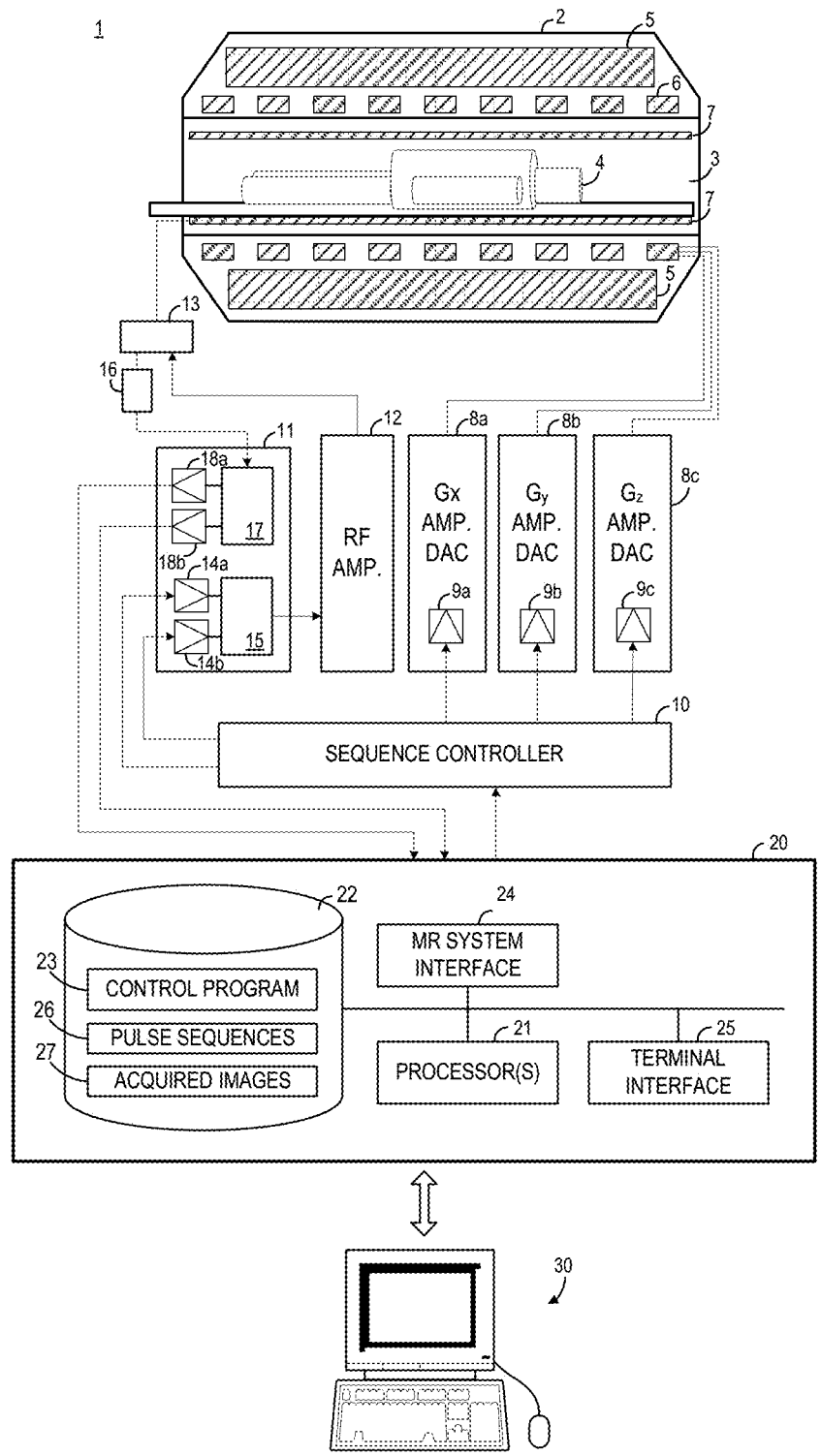
FIG. 1 is a block diagram of an MRI system according to some embodiments.

FIG. 1 illustrates MRI system 1 according to some embodiments. MRI system 1 includes MRI chassis 2, which defines bore 3 in which patient 4 is disposed. MRI chassis 2 includes polarizing main magnet 5, gradient coils 6 and RF coil 7 arranged about bore 3. According to some embodiments, polarizing main magnet 5 generates a uniform main magnetic field ($B_0$) and RF coil 7 emits an excitation field ($B_1$).

According to MRI techniques, a substance (e.g., human tissue) is subjected to a main polarizing magnetic field (i.e., $B_0$), causing the individual magnetic moments of the nuclear spins in the substance to process about the polarizing field in random order at their characteristic Larmor frequency, in an attempt to align with the field. A net magnetic moment $M_z$ is produced in the direction of the polarizing field, and the randomly-oriented magnetic components in the perpendicular plane (the x-y plane) cancel out one another.

The substance is then subjected to an excitation field (i.e., $B_1$) created by emission of a radiofrequency (RF) pulse, which is in the x-y plane and near the Larmor frequency, causing the net aligned magnetic moment $M_z$ to rotate into the x-y plane so as to produce a net transverse magnetic moment $M_t$, which is rotating, or spinning, in the x-y plane at the Larmor frequency. The excitation field is terminated and signals are emitted by the excited spins as they return to their pre-excitation field state. The emitted signals are detected, digitized and processed to reconstruct an image using one of many well-known MRI reconstruction techniques.

An RF pulse may be emitted as a magnetization preparation step in order to enhance or suppress signals from certain tissue so as to generate desired levels of contrast in the resulting image. For example, an inversion, or saturation, pulse is used in non-contrast-enhanced angiography to suppress venous blood in order to highlight the arterial system.

Gradient coils 6 produce magnetic field gradients $G_x$, $G_y$, and $G_z$ which are used for position-encoding NMR signals. The magnetic field gradients $G_x$, $G_y$, and $G_z$ distort the main magnetic field in a predictable way so that the Larmor frequency of nuclei within the main magnetic field varies as a function of position. Accordingly, an excitation field $B_1$ which is near a particular Larmor frequency will tip the net aligned moment $M_z$ of those nuclei located at field positions which correspond to the particular Larmor frequency, and signals will be emitted only by those nuclei after the excitation field $B_1$ is terminated.

Gradient coils 6 may consist of three windings, for example, each of which is supplied with current by an amplifier 8a-8c in order to generate a linear gradient field in its respective Cartesian direction (i.e., x, y, or z). Each amplifier 8a-8c includes a digital-analog converter 9a-9c which is controlled by a sequence controller 10 to generate desired gradient pulses at proper times.

Sequence controller 10 also controls the generation of RF pulses by RF system 11 and RF power amplifier 12. RF system 11 and RF power amplifier 12 are responsive to a scan prescription and direction from sequence controller 10 to produce RF pulses of the desired frequency, phase, and pulse amplitude waveform. The generated RF pulses may be applied to the whole of RF coil 7 or to one or more local coils or coil arrays. RF coil 7 converts the RF pulses emitted by RF power amplifier 12, via multiplexer 13, into a magnetic alternating field in order to excite the nuclei and align the nuclear spins of the object to be examined or the region of the object to be examined. As mentioned above, RF pulses may be emitted in a magnetization preparation step in order to enhance or suppress certain signals.

The RF pulses are represented digitally as complex numbers. Sequence controller 10 supplies these numbers in real and imaginary parts to digital-analog converters 14a-14b in RF system 11 to create corresponding analog pulse sequences. Transmission channel 15 modulates the pulse sequences with a radio-frequency carrier signal having a base frequency corresponding to the resonance frequency of the nuclear spins in the volume to be imaged.

RF coil 7 both emits radio-frequency pulses as described above and scans the alternating field which is produced as a result of processing nuclear spins, i.e. the nuclear spin echo signals. The received signals are received by multiplexer 13, amplified by RF amplifier 16 and demodulated in receiving channel 17 of RF system 11 in a phase-sensitive manner. Analog-digital converters 18a and 18b convert the demodulated signals into a real part and an imaginary part.

Computing system 20 receives the real and imaginary parts and reconstructs an image therefrom according to known techniques. System 20 may comprise any general-purpose or dedicated computing system. Accordingly, system 20 includes one or more processing units 21 (e.g., processors, processor cores, execution threads, etc.) configured to execute processor-executable program code to cause system 20 to operate as described herein, and storage device 22 for storing the program code. Storage device 22 may comprise one or more fixed disks, solid-state random access memory, and/or removable media (e.g., a thumb drive) mounted in a corresponding interface (e.g., a USB port).

Storage device 22 stores program code of control program 23. One or more processing units 21 may execute control program 23 to cause system 20 to perform any one or more of the processes described herein. For example, one or more processing units 21 may execute control program 23 to cause system 20 to change parameters of charge blocks of a pulse sequence based on available charge as described herein. Pulse sequences 26 include data specifying the parameters of pulse sequences and their constituent building blocks and readout events. Pulse sequences 26 may include pulse sequences which have been input to the process described herein as well as pulse sequences which have been changed as a result thereof.

One or more processing units 21 may execute control program 23 to cause system 20 to receive the real and imaginary parts of a received RF signal via MR system interface 24 and reconstruct an image therefrom according to known techniques. Such an image may be stored among acquired images 28 of storage device 22.

One or more processing units 21 may also execute control program 23 to provide instructions to sequence controller 10 via MR system interface 24. For example, sequence controller 10 may be instructed to initiate a desired pulse sequence of pulse sequences 26. In particular, sequence controller 10 may be instructed to control the switching of magnetic field gradients via amplifiers 8a-8c at appropriate times, the transmission of radio-frequency pulses having a specified phase and amplitude at specified times via RF system 11 and RF amplifier 12, and the readout of the resulting magnetic resonance signals.

Acquired images 27 may be provided to terminal 30 via terminal interface 25 of system 20. Terminal interface 25 may also receive input from terminal 30, which may be used to provide commands to control program 23 in order to control sequence controller 10 and/or other elements of system 1. The commands may specify pulse sequence parameter values which are used by system 20. Such parameter values may include original and changed flip angles associated with a pulse sequence building block. Terminal 30 may simply comprise a display device and an input device coupled to system 20. In some embodiments, terminal 30 is a separate computing device such as, but not limited to, a desktop computer, a laptop computer, a tablet computer, and a smartphone.

Each element of system 1 may include other elements which are necessary for the operation thereof, as well as additional elements for providing functions other than those described herein. Storage device 22 may also store data and other program code for providing additional functionality and/or which are necessary for operation of system 20, such as device drivers, operating system files, etc.

Figure 2:
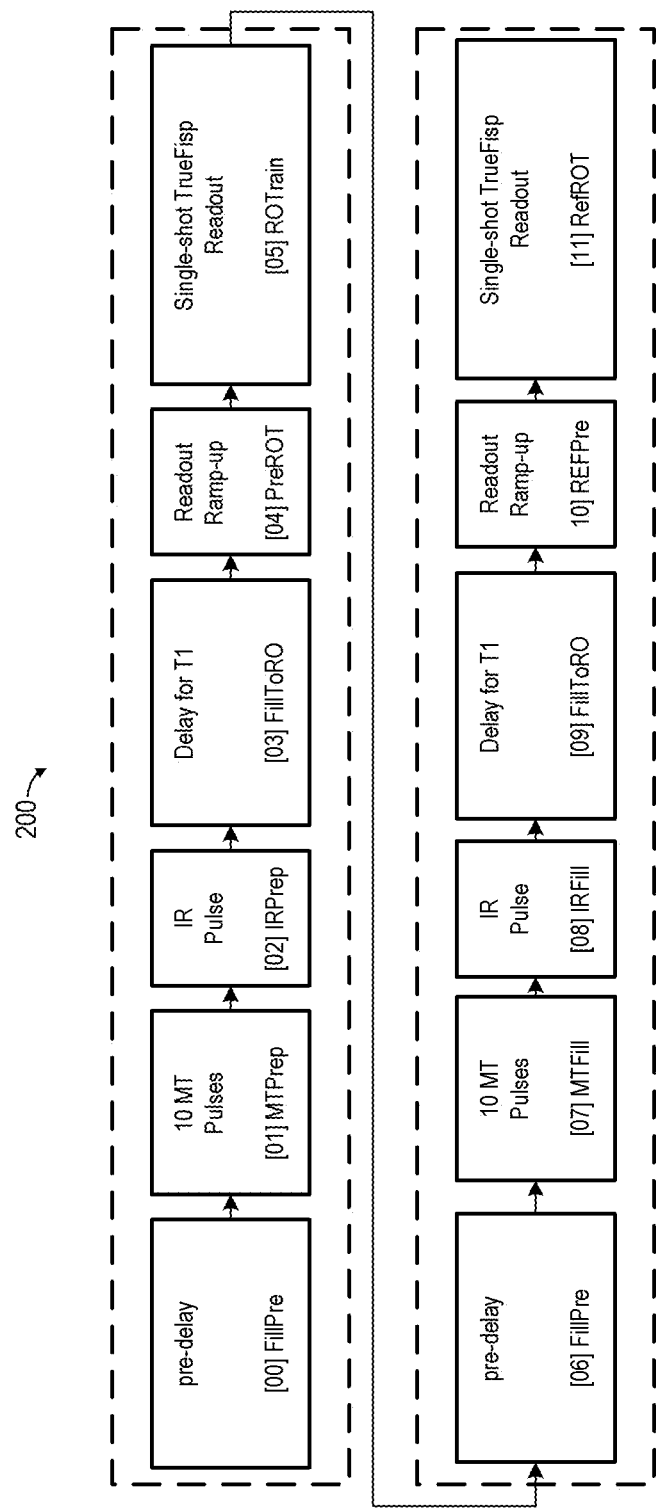
FIG. 2 illustrates charge blocks of a pulse sequence according to some embodiments.

Pulse sequences, such as pulse sequences 26, are commonly represented as a series of building blocks which are stored in the order in which they will be executed. FIG. 2 illustrates charge blocks of pulse sequence 200 according to some embodiments. One charge block is assigned to each building block of pulse sequence 200 and to each series of readout events.

Pulse sequence 200 combines a high-flip angle MT-pulse series (i.e., 10 pulses) with a trailing IR pulse, a time delay, and a single shot TrueFisp readout with short echo-spacing. According to the illustrated protocol, the effective repetition includes two heartbeats depicted using dashed lines, respectively. In the first heartbeat, the blocks are a time delay after the R-wave ([00] FillPre), the preparation consisting of 10 MT pulses ([01] MTPrep), the IR preparation ([02] IRPrep), another time delay to realize the protocol's TI ([03] Fill-ToRO), the ramp-up of the Trufi readout ([04] PreROT), and the readout train ([05] ROTrain). In the second heartbeat, the reference data is acquired by executing the same timing, but replacing the preparations with time delays and choosing low flip angles for the reference readout ([11] RefROT) and its ramp-up ([10] REFPre).

Figure 3A:
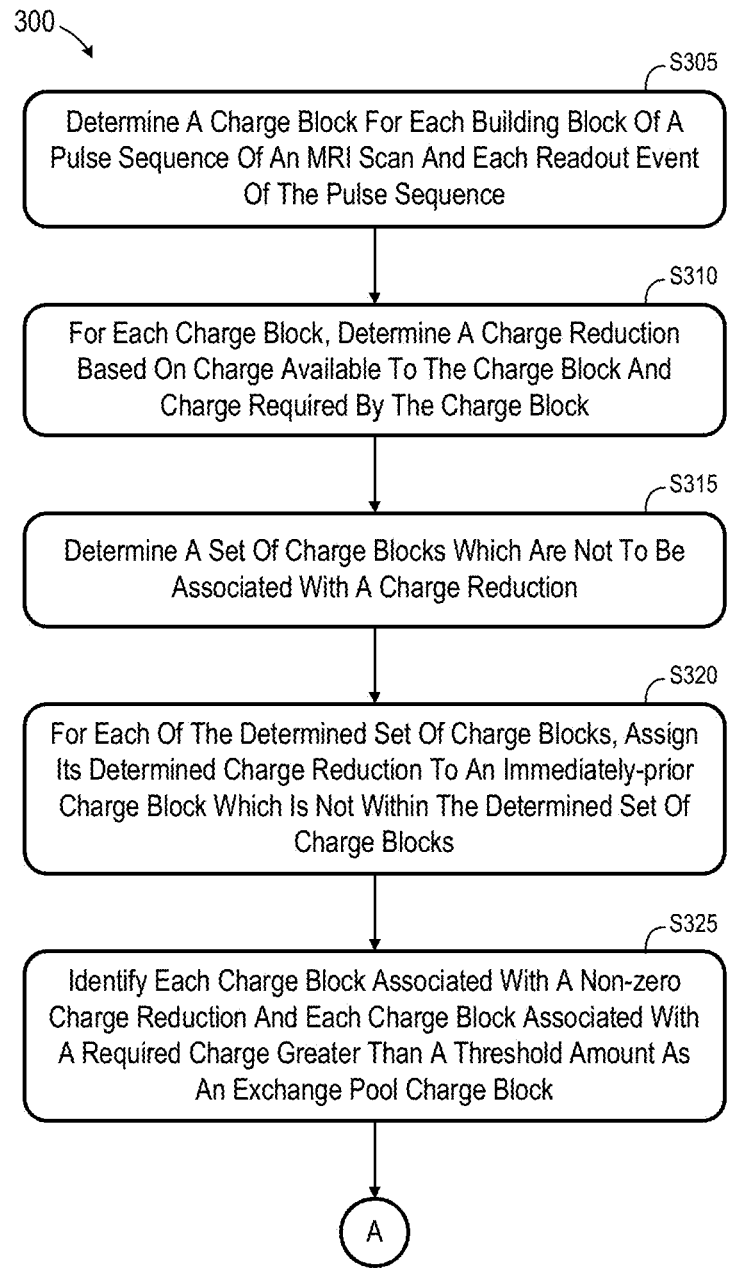
FIGS. 3A and 3B comprise a flow diagram of a process according to some embodiments.
Figure 3B:
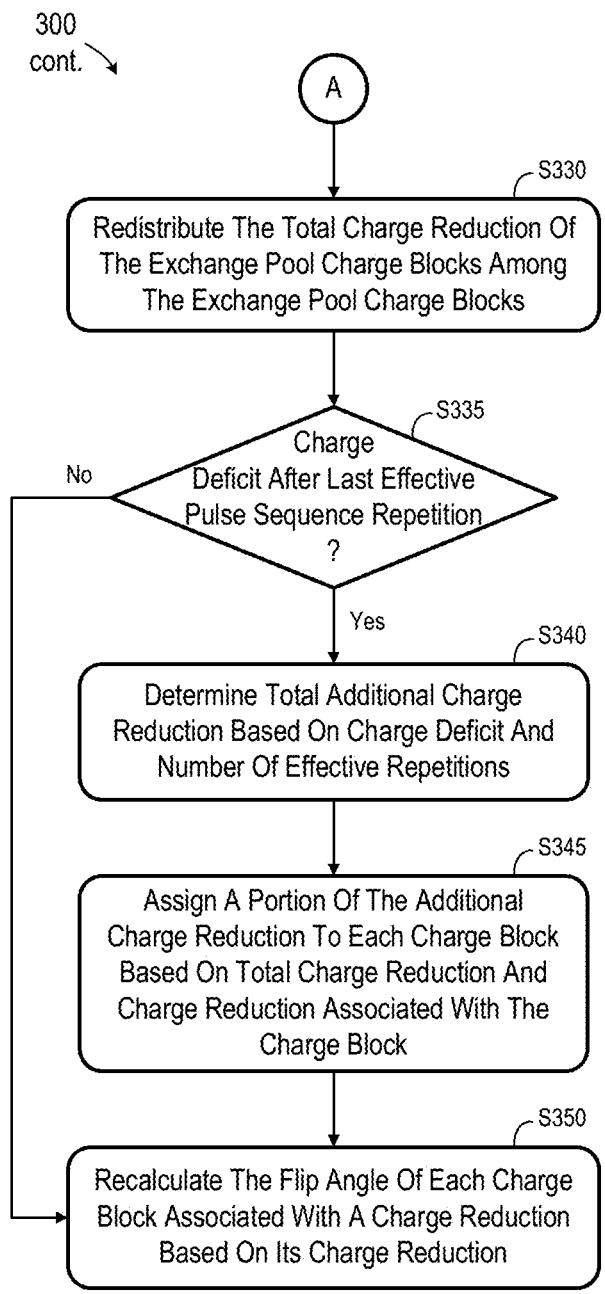

FIGS. 3A and 3B comprise a flowchart of process 300 according to some embodiments. In some embodiments, various hardware elements of system 1 (e.g., one or more processors) execute program code to perform process 300. Process 300 and all other processes mentioned herein may be embodied in processor-executable program code read from one or more of non-transitory computer-readable media, such as a floppy disk, a disk-based or solid-state hard drive, CD-ROM, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Initially, at S305, a charge block is determined for each building block of a pulse sequence of an MRI scan and for each readout event of the pulse sequence. The pulse sequence is an effective repetition according to some embodiments. Several properties are determined for each charge block, many of which may be determined from the building blocks which conventionally define the pulse sequence. One such property is a pointer to the sequence building block represented by the charge block. This pointer may be used to pass information to the corresponding sequence building block, for example to instruct the sequence building block to reduce its flip angle.

According to some embodiments, the properties of a charge block further include a charge per request and a duration. The duration of the charge block equals the duration per request for individual pulse sequence building blocks. For readout events, the duration of the corresponding charge block equals the duration per request of a single readout event multiplied by the number of consecutive readout events, which are in turn grouped together into one charge block.

Some conventional MRI systems allow a user to query a charge per request of a pulse sequence building block. Such systems compute the charge per request based on the specified properties of the building block and on system/site-specific parameters. These system/site-specific parameters may depend on the cabling, coils, dampening and other electrical parameters of the MRI system. Examples of determination of a charge per request will be provided below, so as not to interrupt the present description of process 300.

Other properties associated with each charge block at S305 may include a flag (e.g., "bLastBlockInTReff"), which indicates a block which is the last block within the effective repetition, and a flag indicating whether a charge reduction is allowed (e.g., "bScalingAllowed"). This latter flag may be a constant property of a building block and may be set to false, for example, for charge blocks associated with adiabatic pulses. A flag (e.g., "bFairExchange") may also indicate whether the charge block will take part in the fair exchange of charge as described below. This flag may initially be set to false.

Still other properties may be initialized to zero for each charge block at S305. These properties may be used in process 300 and may include a required charge reduction, a fair exchange charge reduction, and an additional charge reduction for multiple effective repetitions. The significance and usage of these properties will be evident from the foregoing description.

Each charge block may further be associated with an importance factor, which represents the importance of maintaining the originally-determined charge per request for the block, relative to the importance factors of the other charge blocks. An optional text string may also be determined to describe the function of the charge block.

FIG. 4 is a tabular representation of a subset of the above-described properties determined at S305 for each of the charge blocks of pulse sequence 200. The properties are listed in the following order: index, description, original charge, block duration, and bLastInTReff. According to some embodiments, process 300 is implemented in the sequence framework so it is available to all pulse sequences and labor-intensive separate implementation into each sequence would be unnecessary. The table of FIG. 4 could be implemented as linked list or chain, and its entries (i.e., the charge block properties) could be implemented into the basic building block class so as to then be available to all derived building block classes.

The block duration is given in microseconds in FIG. 4. The standard unit of charge is Coulomb (i.e., Ampere seconds). However, according to the charge calculation provided by some systems, the unit of charge is microseconds. Converting from the standard unit of charge requires the reference voltage, the cable dampening between the RF power amplifier and the excitation coil, and other system parameters.

At S310, a charge reduction is determined for each charge block based on the charge available to the charge block and the charge required by the charge block. FIG. 5 illustrates a table of the FIG. 4 charge blocks and some associated properties for the purpose of explaining S310 according to some embodiments.

The column "original charge" indicates the net charge per request associated with the charge block, and the "charge sum" indicates the amount of charge remaining after execution of the charge block. It will be assumed that the capacitors of the RF power amplifier are continuously recharging such that some blocks (e.g., [00] FillPre) are associated with a positive original charge (i.e., the available charge is greater at the end of the charge block than at the beginning of the charge block).

A charge block that requires a larger "original charge" than the current "charge sum" would cause the RF power amplifier to run out of charge. To avoid this, the block is assigned a "required charge reduction" at S310. The block is therefore allowed to use its original charge per request minus the required charge reduction. Practically, this may achieved by reducing the flip angle of the block.

The present example assumes that the maximum charge that can be stored is $Q\_max=+20000.00$. Assuming that the sequence begins at full charge, the available charge at the end of [00] FillPre will still be +20000.00 even though [00] FillPre is associated with a positive original charge of +16,707. The next charge block [01] MTPrep is associated with a negative charge of −18964.87, therefore, as shown in the associated row of the charge sum column, the available charge at the end of charge block [01] MTPrep is +20000.00+(−18964.87)=+01035.13.

[02] IRprep requires more charge (i.e., −01586.20) than is available after [01] MTPrep (i.e., +01035.13), therefore [02] IRprep is assigned a required reduction equal to the shortfall in charge (i.e., −01586.20+(+01035.13)=−00551.07). The charge sum of [02] IRprep therefore equals the charge sum of [01] MTPrep plus the original charge of [02] IRprep—the required reserve of [02] IRprep, which equals zero.

[03] FillToRO and [04] PreROT are both associated with a positive charge balance (i.e., they create more charge than they use) so that +00567.42 of stored charge is available after [04] PreROT. [05] ROTrain requires −15113.13 of charge, which is not met by the +00567.42 of available stored charge. Accordingly, [05] ROTrain is assigned a required reduction of −15113.13+(+00567.42)=−14545.71, as shown in FIG. 5. The magnitude of this required reduction would require considerable scaling down of its flip angle. The below-described "fair exchange" mechanism may allow for a smaller (in absolute value) required reduction and therefore a larger flip angle.

All remaining blocks of the sequence except for [11] RefROT have a net charge generation effect so that the charge sum is increasing. No charge reduction is required for

[11] RefROT because its original charge per request (i.e., −01343.39) is met by the available charge (i.e., +20000.00).

Next, at S315, a set of charge blocks is determined which are not to be associated with a charge reduction. Such charge blocks may be those blocks for which a lesser charge would render them inoperable or cause significant deterioration in image quality, and may be identified by the "bScalingAllowed" mentioned above. For example, [02] IRPrep is an adiabatic pulse that should therefore not be scaled down in flip angle.

Accordingly, at S320, for each of the set of blocks determined at S315, a determined charge reduction is assigned to an immediately prior block in the sequence which is not itself a member of the set of blocks determined at S315. Therefore, the required reduction of [02] IRPrep is assigned to the required reduction of [01] MTPrep as shown in FIG. 6.

Consequently after S320, the required reduction of [02] IRPrep is zero, whereas the required reduction of [01] MTPrep equals its former value plus the former value of [02] IRPrep, resulting in −551.07. In the embodiment shown in the example, the original charge o [02] IRPrep is also moved to [01] MTPrep, resulting in a new original charge of [02] IRPrep (i.e., zero) and a new original charge of [01] MTPrep (i.e., −20,551.07=the sum of −551.07 and −18,964.87). As a result, the charge sum of [01] MTPrep is exactly zero. This charge sun results from the specific bookkeeping of the illustrated embodiment and does not indicate that no charge is left to execute [02] IRPrep. Rather, the charge required for executing [02] IRPrep in unaltered form is already anticipated and accounted for by [01] MTPrep. The depicted embodiment shall be understood as non-limiting and other embodiments are possible for which the original charge remains unchanged and an additional charge block property reflects the redistributed charge.

Charge blocks are identified for inclusion in an exchange pool at S325. According to some embodiments, the exchange pool charge blocks are those which are associated with a non-zero charge reduction (e.g., [01] MTPrep and [05] ROTrain), and those associated with a large original charge request (e.g., >50% of Q_max), even if the latter charge blocks are not associated with a charge reduction. As shown in FIG. 7, exchange pool charge blocks are identified by setting the corresponding flag "bPartofShare" to true.

At S330, the total charge reduction associated with the exchange pool charge blocks is redistributed among the exchange pool charge blocks. According to some embodiments, the amount to which a charge block contributes to the redistribution is proportional to the original charge per request of the charge block. For example, a new charge reduction may be assigned to an exchange pool charge block by multiplying the total required charge reduction (i.e., the sum of all required charge reductions of all charge blocks) by the ratio of the charge block's original charge to the sum of the original charges of all the exchange pool charge blocks.

The new charge reduction determined for each exchange pool block at S330 is equal to the previously-determined required reduction plus a "fair exchange reduction". For clarity, the required reduction and the fair exchange reduction may be saved in separate table columns as shown in FIG. 7.

In the specific example of FIG. 7, charge blocks [01] MTPrep and [05] ROTrain are flagged as exchange pool charge blocks. The total charge reduction associated with all charge blocks is (−551.07+(−14,545.71))=−15,096.78. In the case of charge block [01] MTPrep, the above-mentioned ratio is −20,551.07/(−20,551.07−15,113.13)=0.5762. Accordingly, in some embodiments, the new charge reduction determined for charge block [01] MTPrep is −15,096.78*0.5762=−8,699.34. The fair exchange reduction for charge block [01] MTPrep is therefore −8699.34−(−551.07)=−8,148.27.

Since there are only two blocks in the exchange pool, this fair exchange reduction is distributed as additional charge to charge block [05] ROTrain as shown in FIG. 7. The distributed value (i.e., +7,850.49) may also be computed as described above. Consequently, [05] ROTrain is required to save less charge than originally determined and can therefore run with a higher flip angle than with the originally-determined charge reduction. FIG. 7 also shows updates to the charge sum column based on the new net charge reductions (i.e., required reduction+fair exchange reduction) of charge blocks [01] MTPrep and [05] ROTrain.

For sequences with a short effective repetition and/or many effective repetitions, it is possible that the RF power amplifier runs out of charge before all effective repetitions have been played out. Accordingly, at S335, it is determined whether a charge deficit exists after the last effective pulse sequence repetition. For example, FIG. 7 shows the charge sum after [11] RefROT (i.e., the total remaining charge at the end of the last charge block) as +18,656.61. Accordingly, 20,000 (charge at start of repetition)−18,656.61 (charge at end of repetition)=1,343.39 charge is lost during each effective TR. 20,000 is the maximum charge the RF power amplifier can store, and the ratio 20,000/1,343.39 is 14.88. Therefore, the RF power amplifier would run out of charge during the $15^{th}$ repetition of the effective TR.

If a charge deficit per repetition exists, for example 1,343.39 as calculated above, a total additional charge reduction is determined based on the charge deficit per repetition and the total number of repetitions. In some embodiments, the total additional charge reduction is equal to the determined charge deficit per repetition multiplied by the total number of repetitions.

A portion of the total additional charge reduction is assigned to each block at S345. The portion may be assigned by dividing the total additional charge reduction by the number of effective repetitions to obtain the required charge reduction per effective repetition, and then assigning an additional charge reduction per charge block. For each charge block, the latter is calculated by multiplying the required charge reduction per effective repetition by the ratio of the maximum possible charge saving of this charge block to the sum of the maximum possible charge savings of all charge blocks within the repetition. The maximum possible charge saving of a given charge block is equal to the original charge in the block minus the sum of the already applied charge reductions (i.e., maximum possible charge reduction=original charge—required reduction—fair exchange reduction).

At S350, the flip angle of each charge block associated with a net charge reduction is recalculated based on the net charge reduction. Recalculation of the flip angle of a charge block ensures that the charge block actually saves the charge the determined amount of charge. In the present example, flip angles are recalculated for charge blocks [01] MTPrep and [05] ROTrain based on their net charge reductions (i.e., required reduction+fair exchange reduction+additional charge reduction). Recalculation of a flip angle may comprise scaling down the flip angle in proportion to the ratio of the original charge of the block to the reduced charge of the block (i.e., new flip angle=original flip angle*original charge/(original charge+required reduction+fair exchange reduction+additional charge reduction)).

According to some embodiments, the flip angles of the preparation and readout blocks are reduced only on the module level. No protocol flip angles (even if available) are modified. Instead, tooltips may be provided that show the actually-played angle, and the reduction factors due to clipping prevention and due to required charge reserve. Such tooltips can be provided for the principal parameter "flip angle", which is the readout flip angle. Tooltips may also be provided for specific modules known to consume a lot of charge, such as a T2-preparations.

For preparation modules, the tooltip may be attached to a user interface item logically belonging to the preparation module, for example to the magnetization preparation element. The block's flip angle itself need not be displayed. One advantage of this tooltip approach over the protocol modification is independence from patient loading and reference voltage. A protocol will therefore not become inconsistent if a higher reference voltage is needed for one patient but the protocol was created with a lower reference voltage. Another advantage is that the sequence will run with flip angles as close to the user-desired or predetermined optimal flip angles as possible and will use the available charge according to the determined net charge reductions.

FIGS. 8 and 9 show contrast UI 800 and special UI 900, respectively. Tooltips 810 and 910 display the actually-played flip angles calculated according to embodiments of process 300. UI 800 and UI 900 may be presented to an operator on terminal 30 via execution of control program 23).

Also using terminal 30, the operator may issue a command to execute the pulse sequence modified as described herein. Specifically, RF pulses are generated based on the parameter values of the modified pulse sequence as is known in the art (e.g., by RF system 11 and RF amplifier 12 under control of sequence controller 10) and delivered within an MRI imaging sequence.

Embodiments may model different charge storage capacities and recharge rates. Rules could be created that only allow the use of a "Q_max_extreme" once per given period of time and use of a smaller Q_max otherwise, to prevent overheating of the RF components.

The foregoing provides an example of determination of a charge per request according to some embodiments:

Charge (Q) of one readout train in unit ms:
1) Consumed charge: dQUsedReadout_ms=Norm_factor*(dQExcite_ms+num_refoc_pulses*dQRefocusing_ms)= Norm_factor*(-1000.0*getdExciteMagnitudeIntegralVs( )-1000.0*num_refoc_pulses*getdRefocusingMagnitudeIntegralVs( ));
2) Regenerated charge: dQRegeneratedDuringReadout_ms= RecoverRate*getIDurationPerRequest_us( )/1000.0
3) ChargePerRequest_ms=dQUsedReadout_ms+dQRegeneratedDuringReadout_ms A negative ChargePerRequest_ms indicates that the associated block requires more charge than what is regenerated during its DurationPerRequest by constant capacitor recharging.

The NormFactor is a function of maximum RF Power amplifier voltage, transmission cable dampening, transmission cable reflection, gain factors, derating limits, etc. The Norm_Factor may be calculated as follows:

$$\text{Norm\_Factor} = d\text{GainVarFactor}/d U\text{Max\_}V/d\text{CableDamping};$$

where dGainVarFactor is the gain variation factor, which is the ratio of nominal and real voltage at Tales level (Tales is one of the hardware components of the scanner), dUMax_V is the maximum transmitter voltage derived from the maximum power that the RF power amplifier can provide, dUMax_V=sqrt(50.0*dRFPAPowerMax), and dCableDamping is the scanner setup-dependent transmit cable dampening which may be obtained by querying the system properties.

In different scenarios (e.g., depending on certain cable reflection values), further inputs into this equation may be used, for example as defined below:

```
// calculate Q-Norm factor
    if( dDicoReflection <= dDeratingReflectionLimit )
    {
        dQNormFactor = dGainVarFactor
            / dUMax_V
            / dCableDamping;
    }
    else if( dDicoReflection <= dQuadraticDeratingReflectionLimit )
    {
        dQNormFactor = (1.0+dDicoReflection)
            / (1.0+dDeratingReflectionLimit) * dGainVarFactor
            / dUMax_V
            / dCableDamping;
    }
    else
    {
        dQNormFactor = (1.0 +
         (dDicoReflection*dDicoReflection)/dQuadraticDeratingReflectionLimit )
            / (1.0+dDeratingReflectionLimit) * dGainVarFactor
            / dUMax_V
            / dCableDamping;
    }
```

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation of a system according to some embodiments may include a processor to execute program code such that the computing device operates as described herein.

All systems and processes discussed herein may be embodied in program code stored on one or more non-transitory computer-readable media. Such media may include, for example, a floppy disk, a CD-ROM, a DVD-ROM, a Flash drive, magnetic tape, and solid state Random Access Memory (RAM) or Read Only Memory (ROM) storage units. Embodiments are therefore not limited to any specific combination of hardware and software.

Embodiments described herein are solely for the purpose of illustration. Those in the art will recognize other embodiments may be practiced with modifications and alterations to that described above.

What is claimed is:

1. A system comprising:
    a chassis defining a bore;
    a main magnet to generate a polarizing magnetic field within the bore;
    a gradient system to apply a gradient magnetic field to the polarizing magnetic field;
    a radio frequency system to transmit RF pulses to patient tissue disposed within the bore and to receive signals from the patient tissue; and
    a computing system to execute program code to:
    determine a charge block for each building block of an MRI pulse sequence and for each readout event of the MRI pulse sequence;
    for each of the charge blocks, determine a charge per request associated with the charge block;
    for each of the charge blocks, determine an associated charge reduction based on the charge per request associated with the charge block and on a charge available to the charge block after execution of a previous charge block of the MRI pulse sequence;
    for each of the charge blocks associated with a non-zero charge reduction, determine a flip angle of the corresponding building block of the MRI pulse sequence based on the charge per request and the charge reduction associated with the charge block; and
    control the radio frequency system to deliver the MRI pulse sequence based on the determined flip angles of each of the building blocks of the MRI pulse sequence corresponding to the charge block associated with a non-zero charge reduction.

2. The system according to claim 1, wherein the determination of the associated charge reduction based on the charge per request associated with the charge block further comprises:
    identification of one or more of the charge blocks which is associated with a non-zero charge reduction and which is not associated with a charge reduction; and
    for each of the identified one or more of the charge blocks which is not associated with a charge reduction, moving the associated charge reduction to a prior charge block which is associated with a non-zero charge reduction.

3. The system according to claim 2, wherein the determination of the associated charge reduction based on the charge per request associated with the charge block further comprises:
    identify a repetition of two or more of the charge blocks, each of the repetition of two or more of the charge blocks being associated with a non-zero charge reduction; and
    redistribute a total charge reduction associated with each one of the repetition of two or more of the charge blocks among the repetition of two or more of the charge blocks based on the charge per request associated with each one of the repetition of two or more of the charge blocks.

4. The system according to claim 3, wherein the redistribution of the total charge reduction associated with each one of the repetition of two or more of the charge blocks comprises:
    for each one of the repetition of two or more of the charge blocks, multiply the total charge reduction by the ratio of the charge per request associated with the one of the repetition of two or more of the charge blocks to the sum of the charges per request of all of the repetition of two or more of the charge blocks.

5. The system according to claim 3, wherein the repetition of two or more of the charge blocks further include ones of the charge blocks which are associated with a charge per request greater than a threshold amount and which are not associated with a non-zero charge reduction.

6. The system according to claim 5, wherein the redistribution of the total charge reduction associated with each one of the repetition of two or more of the charge blocks comprises:
    for each one of the repetition of two or more of the charge blocks, multiply the total charge reduction by the ratio of the charge per request associated with the one of the repetition of two or more of the charge blocks to the sum of the charges per request of all of the repetition of two or more of the charge blocks.

7. The system according to claim 1, further comprising:
    a display,
    wherein the computing system is to execute program code to control the display to display a tooltip indicating the determined flip angle of one of the building blocks of the MRI pulse sequence.

8. A computer-implemented method comprising:
    determining a charge block for each building block of an MRI pulse sequence and for each readout event of the MRI pulse sequence;
    for each of the charge blocks, determining a charge per request associated with the charge block;
    for each of the charge blocks, determining an associated charge reduction based on the charge per request associated with the charge block and on a charge available to the charge block after execution of a previous charge block of the MRI pulse sequence;
    for each of the charge blocks associated with a non-zero charge reduction, determining a flip angle of the corresponding building block of the MRI pulse sequence based on the charge per request and the charge reduction associated with the charge block; and
    controlling a radio frequency system to deliver the MRI pulse sequence based on the determined flip angles of each of the building blocks of the MRI pulse sequence corresponding to the charge block associated with the non-zero charge reduction.

9. The computer-implemented method according to claim 8, wherein the determining the associated charge reduction based on the charge per request associated with the charge block further comprises:

identifying one or more of the charge blocks which is associated with a non-zero charge reduction and which is not associated with a charge reduction; and for each of the identified one or more of the charge blocks which is not associated with a charge reduction, moving the associated charge reduction to a prior charge block which is associated with a non-zero charge reduction.

10. The computer-implemented method according to claim 9, wherein the determining the associated charge reduction based on the charge per request associated with the charge block further comprises:

identifying a repetition of two or more of the charge blocks, each of the repetition of two or more of the charge blocks being associated with a non-zero charge reduction; and redistributing a total charge reduction associated with each one of the repetition of two or more of the charge blocks among the repetition of two or more of the charge blocks based on the charge per request associated with each one of the repetition of two or more of the charge blocks.

11. The computer-implemented method according to claim 10, wherein the redistributing the total charge reduction associated with each one of the repetition of two or more of the charge blocks comprises:

for each one of the repetition of two or more of the charge blocks, multiplying the total charge reduction by the ratio of the charge per request associated with the one of the repetition of two or more of the charge blocks to the sum of the charges per request of all of the repetition of two or more of the charge blocks.

12. The computer-implemented method according to claim 10, wherein the repetition of two or more of the charge blocks further include ones of the charge blocks which are associated with a charge per request greater than a threshold amount and which are not associated with a non-zero charge reduction.

13. The computer-implemented method according to claim 12, wherein the redistributing the total charge reduction associated with each one of the repetition of two or more of the charge blocks comprises:

for each one of the repetition of two or more of the charge blocks, multiplying the total charge reduction by the ratio of the charge per request associated with the one of the repetition of two or more of the charge blocks to the sum of the charges per request of all of the repetition of two or more of the charge blocks.

14. The computer-implemented method according to claim 8, further comprising:

displaying a tooltip indicating the determined flip angle of each of the building blocks of the MRI pulse sequence.

15. A non-transitory computer-readable medium storing program code, the program code executable by a computer system to cause the computer system to:

determine a charge block for each building block of an MRI pulse sequence and for each readout event of the MRI pulse sequence;

for each of the charge blocks, determine a charge per request associated with the charge block;

for each of the charge blocks, determine an associated charge reduction based on the charge per request associated with the charge block and on a charge available to the charge block after execution of a previous charge block of the MRI pulse sequence;

for each of the charge blocks associated with a non-zero charge reduction, determine a flip angle of the corresponding building block of the MRI pulse sequence based on the charge per request and the charge reduction associated with the charge block; and control a radio frequency system to deliver the MRI pulse sequence based on the determined flip angles of each of the building blocks of the MRI pulse sequence corresponding to the charge block associated with the non-zero charge reduction.

16. The non-transitory computer-readable medium according to claim 15, wherein the determination of the associated charge reduction based on the charge per request associated with the charge block further comprises:

identification of one or more of the charge blocks which is associated with a non-zero charge reduction and which is not associated with a charge reduction; and for each of the identified one or more of the charge blocks which is not associated with a charge reduction, moving the associated charge reduction to a prior charge block which is associated with a non-zero charge reduction.

17. The non-transitory computer-readable medium according to claim 16, wherein the determination of the associated charge reduction based on the charge per request associated with the charge block further comprises:

identification of a repetition of two or more of the charge blocks, each of the repetition of two or more of the charge blocks being associated with a non-zero charge reduction; and redistribution of a total charge reduction associated with each one of the repetition of two or more of the charge blocks among the repetition of two or more of the charge blocks based on the charge per request associated with each one of the repetition of two or more of the charge blocks.

18. The non-transitory computer-readable medium according to claim 17, wherein the redistribution of the total charge reduction associated with each one of the repetition of two or more of the charge blocks comprises:

for each one of the repetition of two or more of the charge blocks, multiplication of the total charge reduction by the ratio of the charge per request associated with the one of the repetition of two or more of the charge blocks to the sum of the charges per request of all of the repetition of two or more of the charge blocks.

19. The non-transitory computer-readable medium according to claim 17, wherein the repetition of two or more of the charge blocks further include ones of the charge blocks which are associated with a charge per request greater than a threshold amount and which are not associated with a non-zero charge reduction.

20. The non-transitory computer-readable medium according to claim 19, wherein the redistribution of the total charge reduction associated with each one of the repetition of two or more of the charge blocks comprises:

for each one of the repetition of two or more of the charge blocks, multiplication of the total charge reduction by the ratio of the charge per request associated with the one of the repetition of two or more of the charge blocks to the sum of the charges per request of all of the repetition of two or more of the charge blocks.

* * * * *